United States Patent
Kamatani et al.

(10) Patent No.: US 7,693,196 B2
(45) Date of Patent: Apr. 6, 2010

(54) SEMICONDUCTOR LASER DRIVING UNIT AND IMAGE FORMING APPARATUS HAVING THE SAME

(75) Inventors: Tomohiko Kamatani, Hyogo (JP); Hiroaki Kyogoku, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 62 days.

(21) Appl. No.: 12/173,576

(22) Filed: Jul. 15, 2008

(65) Prior Publication Data
US 2008/0279240 A1    Nov. 13, 2008

Related U.S. Application Data

(62) Division of application No. 11/515,151, filed on Aug. 31, 2006, now Pat. No. 7,573,922.

(30) Foreign Application Priority Data
Sep. 2, 2005    (JP)    ............... 2005-255324

(51) Int. Cl.
*H01S 3/00*    (2006.01)
(52) U.S. Cl. ............... 372/38.01; 372/38.02; 372/38.07

(58) Field of Classification Search ............... 372/38.1, 372/38.01–38.09
See application file for complete search history.

(56) References Cited
FOREIGN PATENT DOCUMENTS
JP    2004-153118    5/2004

*Primary Examiner*—Minsun Harvey
*Assistant Examiner*—Xnning Niu
(74) *Attorney, Agent, or Firm*—Cooper & Dunham LLP

(57) ABSTRACT

A semiconductor laser driving unit is disclosed that includes a first part generating a bias current; a second part generating a first current for causing the semiconductor laser to emit light, and outputting the first current to the semiconductor laser in accordance with an input control signal; a third part performing initialization to detect a light emission characteristic of the semiconductor laser, and causing the second part to generate a second current of a value obtained from the detected light emission characteristic; and a fourth part causing the second part to generate the first current in which a set offset current is added to the second current. The first part detects the amount of light emission of the semiconductor laser, and generates and outputs the bias current so that the amount of light emission produced by the sum of the bias current and the first current is a predetermined value.

2 Claims, 6 Drawing Sheets

SEMICONDUCTOR LASER DRIVING UNIT AND IMAGE FORMING APPARATUS HAVING THE SAME

CROSS-REFERENCE TO RELATED APPLICATION

This application is a divisional of U.S. Ser. No. 11/515,151, filed Aug. 31, 2006 now U.S. Pat. No. 7,573,922, the entire contents of which are incorporated herein by reference.

BACKGROUND OF THE INVENTION

1. Field of the Invention

The present invention relates to a semiconductor laser driving unit that controls driving of a semiconductor laser used for optical writing of laser printers, optical data communications, and optical disks, and to an image forming apparatus using the semiconductor laser driving unit.

2. Description of the Related Art

Generally, laser oscillation of a laser diode starts later than the start of current injection. The delay time is a time required to store carriers until the carrier density reaches the oscillation threshold of the laser diode after the start of injection of current into the laser diode. In order to avoid such oscillation delay, generally, a bias current is caused to constantly flow into the laser diode in the conventional semiconductor laser driving unit.

There are a fixed bias method and a variable bias method as methods of thus causing bias current to flow. According to the fixed bias method, a fixed bias current is caused to constantly flow into a laser diode without following variations in the oscillation threshold current (hereinafter, threshold current) of the laser diode or variations in the characteristics of the laser diode due to changes over time. Therefore, the difference in value between a determined bias current and the threshold current of the laser diode changes over time or differs depending on the individual laser diode, thus resulting in unstable oscillation delay.

According to the variable bias method, means for detecting the threshold current of an individual laser diode is provided, and a current approximating the detected threshold current is selected as a bias current. By intermittently repeating detection of the threshold current of the laser diode, it is possible to follow chronological variations or variations due to temperature changes in the threshold current. The variable bias method is suitable for avoiding variations in oscillation delay in driving a laser diode.

On the other hand, in semiconductor laser driving units, APC (Automatic Power Control) is a common practice as control means for constantly driving a laser diode that is a semiconductor laser with a predetermined amount of light emission. By performing APC, it is possible to obtain a laser driving current iop to flow into the laser diode, the laser driving current iop corresponding to a desired amount of light emission.

According to one semiconductor laser driving unit of a variable bias-fixed light emission current method, first, APC is performed so as to detect a light emission current $i\eta$ corresponding to the difference between the threshold current ith of a laser diode and the current value of a laser driving current iop at which a desired amount of light emission is obtained. The light emission current $i\eta$ of the detected value is generated as a fixed current in a digital-to-analog (D/A) converter (hereinafter, DAC) of a current output type, and the generated light emission current $i\eta$ is caused to serve as a switching current to be controlled and supplied to the laser diode in accordance with an external modulation data signal. Further, every time APC is performed thereafter, a bias current up to the vicinity of the threshold current ith is determined.

Here, the current output-type DAC has a corresponding number of current cells for each bit. For example, as shown in FIG. 1, each bit is weighted with the number of current cells so that the number of current cells is $2^0$ for the first bit, $2^1$ for the second bit, $2^2$ for the third bit, and $2^{n-1}$ for the $n^{th}$ bit. When a bit is "1," current is output from one or more current cells corresponding to the bit. That is, when the $n^{th}$ bit is "1," current is output from the corresponding $2^{n-1}$ current cells. Further, the current cells have the same shape and characteristics.

For this configuration, the speed of starting and stopping current output from each current cell with respect to an input code is always constant in the DAC. Therefore, it is possible to always supply the switching current to the laser diode at the same speed irrespective of the amount of light emission.

In the case of constantly causing a bias current around the threshold current ith to flow into the laser diode in this variable bias method, the amount of light emission by the bias current cannot be ignored particularly if the switching current is small. Generally, the intensity of light emission by a bias current in a laser diode may reach up to 300 μW. That is, if the intensity of light emission by the switching current is 1 mW, the amount of light of 30% of the intensity of light emission is attributed to the bias current. This weak light emission of a laser diode by a bias current causes problems such as background contamination in laser printers and digital copiers. If the inclination η (differential quantum efficiency) with respect to the amount of light emission of a laser diode produced by the light emission current $i\eta$ is degraded and decreased by a change in temperature so that the light emission current $i\eta$ increases, the above-described variable bias-fixed light emission current method supplements an increase in the laser driving current iop with a bias current. Therefore, the laser diode may emit light even in the logic of turning OFF the laser diode.

According to Japanese Laid-Open Patent Application No. 2004-153118, the above-described problem of the light emission of a laser diode even in the "OFF" logic is solved by providing the switching current with an offset current. Addition of an offset current to the switching current causes the bias current to be reduced by the amount of the offset current by APC. That is, the above-described problems can be reduced by determining the offset current so as to prevent the bias current from causing natural light emission and weak light emission at the time of turning OFF a laser diode due to a change in temperature, and by adding the bias current to the switching current.

However, according to the method of adding the offset current to the output current of the DAC, a circuit for generating the offset current should be newly added, thus causing an increase in the power consumption and the circuit area of a semiconductor laser driving unit.

Further, at the time of switching the laser diode from the "OFF" logic to the "ON" logic (the logic of turning ON the laser diode), switching means for performing output control of the offset current and switching means for performing output control of the switching current should be switched at exactly the same time. Further, the switching speeds of both switching means should be exactly the same, and the offset current and the switching current should have exactly the same rise time and fall time.

For example, if the semiconductor laser driving unit is formed of an IC, the differences in rise time and fall time between the offset current and the output current of the DAC due to process variations may cause the amount of light emission from the laser diode to have a step-like waveform, thus causing a problem in that it is difficult to obtain an intended light emission waveform of the laser diode. Further, there is a problem in that as the switching speed of each switching means increases, it becomes difficult to match the rise/fall timings of the output currents of different current generation parts.

SUMMARY OF THE INVENTION

Embodiments of the present invention may solve or reduce one or more of the above-described problems.

According to one embodiment of the present invention, there are provided a semiconductor laser driving unit in which one or more of the above-described problems are solved, and an image forming apparatus including the same.

According to one embodiment of the present invention, there are provided a semiconductor laser driving unit in which an offset current is output from a DAC, the offset current being determined by a code input to the DAC, and the offset current and a fixed light emission current are added up into a switching current, thereby making it possible to reduce power consumption and circuit area and to reduce variations in the switching timing of a semiconductor laser; and an image forming apparatus having the semiconductor laser driving unit.

According to one embodiment of the present invention, there is provided a semiconductor laser driving unit controlling driving of a semiconductor laser by performing automatic power control to automatically control a current to be supplied to the semiconductor laser so that a desired amount of light emission is obtained, the semiconductor laser driving unit including: a bias current generator circuit part configured to generate a predetermined bias current lower than an oscillation threshold current of the semiconductor laser and constantly output the generated bias current to the semiconductor laser; a switching current generator circuit part configured to generate a first current for causing the semiconductor laser to emit light, and to output the generated first current to the semiconductor laser in accordance with a control signal input to the switching current generator circuit part; an initialization circuit part configured to perform a predetermined initialization operation to detect a light emission characteristic of the semiconductor laser, and to cause the switching current generator circuit part to generate a second current of a value obtained from the detected light emission characteristic; and an offset current setting circuit part configured to cause the switching current generator circuit part to generate the first current in which a set offset current is added to the second current, wherein the bias current generator circuit part detects an amount of light emission of the semiconductor laser, and generates and outputs the bias current so that the amount of light emission of the semiconductor laser produced by a sum of the generated bias current and the first current output from the switching current generator circuit part is a predetermined value.

According to one embodiment of the present invention, there is provided an image forming apparatus including a semiconductor laser driving unit controlling driving of a semiconductor laser by performing automatic power control to automatically control a current to be supplied to the semiconductor laser so that a desired amount of light emission is obtained, wherein: the semiconductor laser driving unit comprises a bias current generator circuit part configured to generate a predetermined bias current lower than an oscillation threshold current of the semiconductor laser and constantly output the generated bias current to the semiconductor laser; a switching current generator circuit part configured to generate a first current for causing the semiconductor laser to emit light, and to output the generated first current to the semiconductor laser in accordance with a control signal input to the switching current generator circuit part; an initialization circuit part configured to perform a predetermined initialization operation to detect a light emission characteristic of the semiconductor laser, and to cause the switching current generator circuit part to generate a second current of a value obtained from the detected light emission characteristic; and an offset current setting circuit part configured to cause the switching current generator circuit part to generate the first current in which a set offset current is added to the second current, wherein the bias current generator circuit part detects an amount of light emission of the semiconductor laser, and generates and outputs the bias current so that the amount of light emission of the semiconductor laser produced by a sum of the generated bias current and the first current output from the switching current generator circuit part is a predetermined value.

According to a semiconductor laser driving unit and an image forming apparatus having the same, an offset current of any current value is automatically incorporated into a switching current generated in a switching current generator circuit part, using a current output-type DAC. Therefore, there is no need to provide an independent offset current generator circuit in the internal circuit of the semiconductor laser driving unit. Accordingly, it is possible to reduce the area and the power consumption of the circuit. Further, this configuration is particularly effective in the case where a high speed operation, in which timing control at the time of simultaneously starting the offset current and the switching current matters, is required.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of embodiments of the present invention.

First Embodiment

Figure 1:
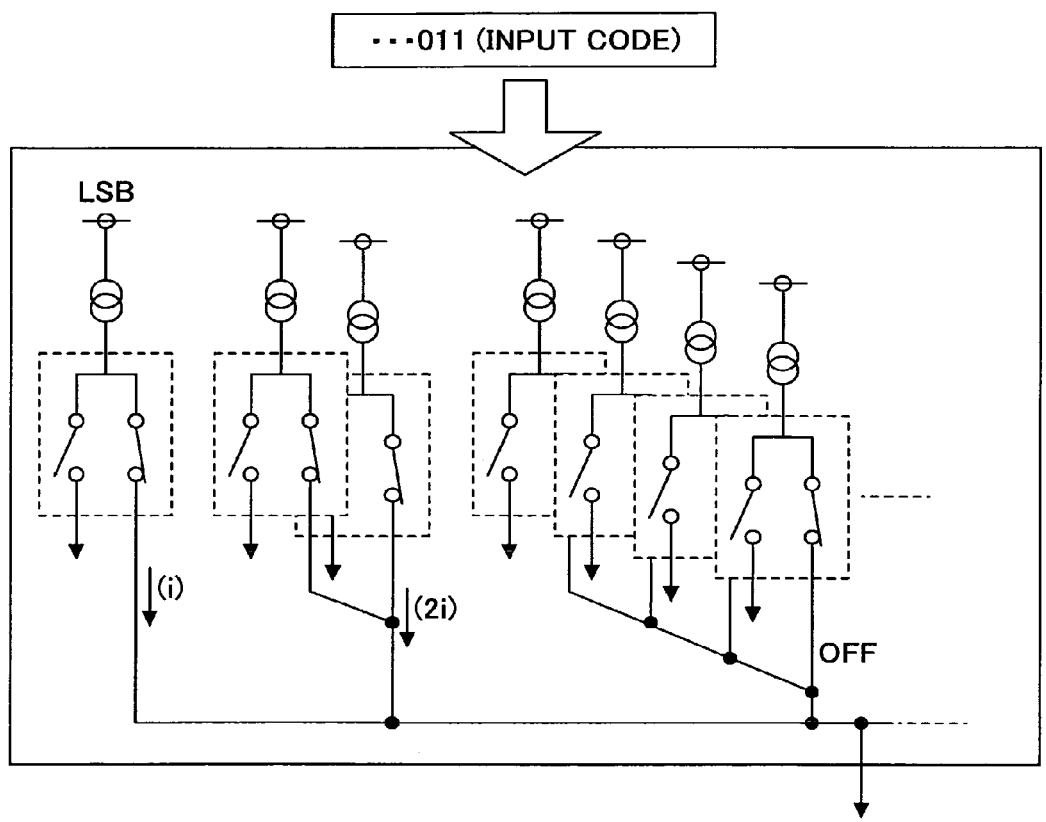
FIG. 1 is a diagram showing a conventional current output-type DAC (digital-to-analog converter)
Figure 2:
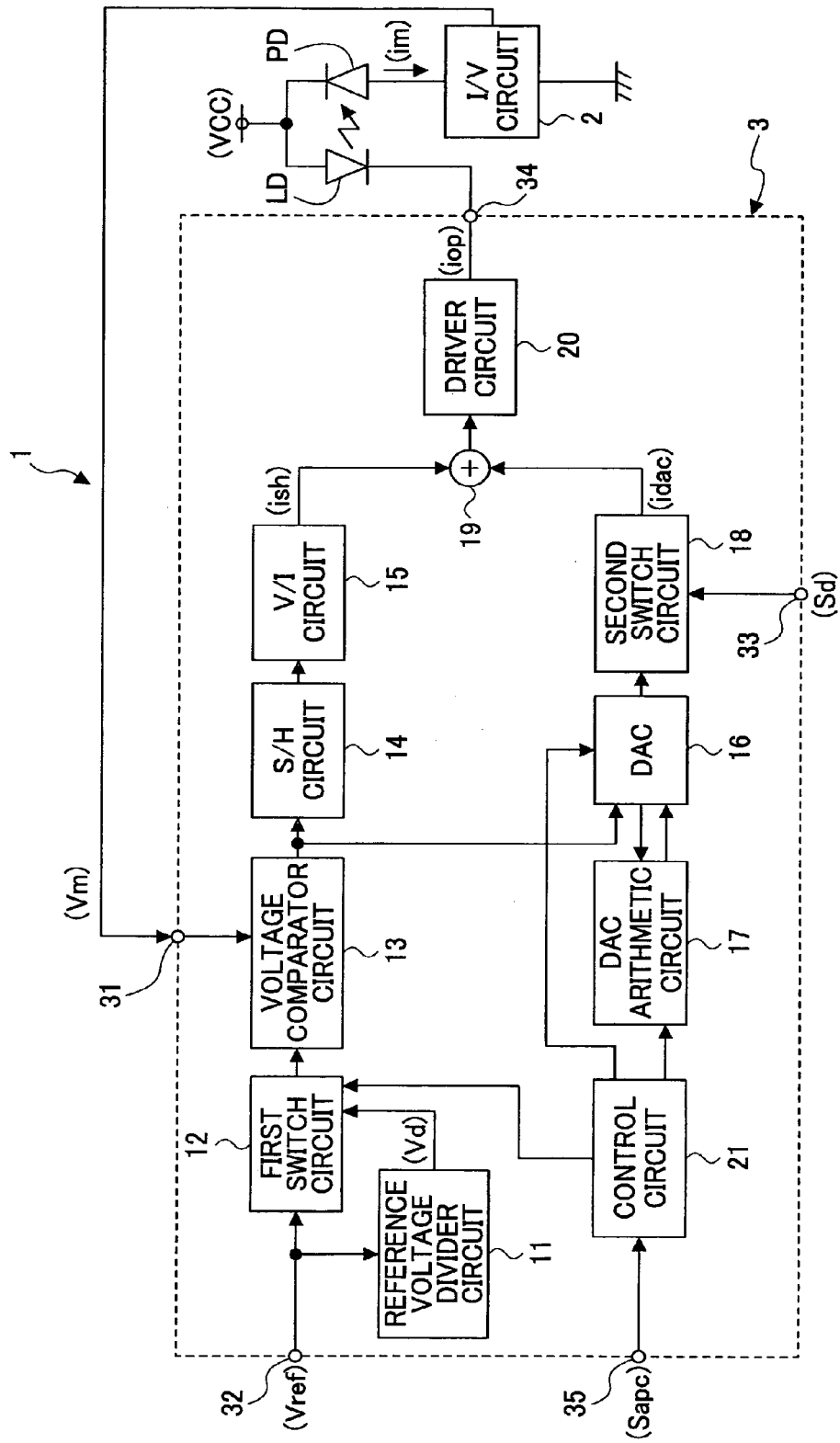
FIG. 2 is a block diagram showing a semiconductor laser driving unit according to a first embodiment of the present invention.

FIG. 2 is a block diagram showing a semiconductor laser driving unit 1 according to a first embodiment of the present invention.

The semiconductor laser driving unit 1 performs control for keeping the amount of light of a laser diode LD always constant, that is, APC, because the forward current-light output (i-L) characteristics of the laser diode LD vary because of a change in temperature or degradation over time. According to the semiconductor laser driving unit 1, an amount of light of the laser diode LD is received by a photodiode PD, and APC is performed in accordance with the received amount of light. The photodiode PD generates a monitor current im proportional to the received amount of light, and the generated monitor current im is subjected to current-voltage conversion so as to be converted into a monitor voltage Vm. Then, the monitor voltage Vm is compared with a reference voltage Vref, and a current output to the laser diode LD is controlled in accordance with the difference in voltage between the monitor voltage Vm and the reference voltage Vref.

Referring to FIG. 2, the semiconductor laser driving unit 1 includes the photodiode PD, a current-voltage converter circuit (hereinafter referred to as "I/V circuit") 2, and a laser diode control circuit 3. The photodiode PD receives the light output of the laser diode LD, and generates and outputs the monitor current im according to the received amount of light. The I/V circuit 2 converts the monitor current im into voltage, and outputs the monitor current im as the monitor voltage Vm. The laser diode control circuit 3 generates a laser driving current iop according to the monitor voltage Vm, and supplies the generated laser driving current iop to the laser diode LD. The laser diode LD outputs light whose amount is in accordance with the laser driving current iop supplied from the laser diode control circuit 3.

The laser diode control circuit 3 includes a reference voltage divider circuit 11 and a first switch circuit 12. The reference voltage divider circuit 11 divides the externally input reference voltage Vref to generate a divided voltage Vd that is (M−N)/M (N and M are positive numbers satisfying N<M) of Vref, and outputs the generated divided voltage Vd. The first switch circuit 12 exclusively outputs one of the divided voltage Vd output from the reference voltage divider circuit 11 and the reference voltage Vref. The laser diode control circuit 3 further includes a voltage comparator circuit 13, a sample-and-hold circuit (hereinafter referred to as "S/H circuit") 14, a voltage-current converter circuit (hereinafter referred to as "V/I circuit") 15, a current output-type DAC 16, a DAC arithmetic circuit 17, a second switch circuit 18, an adder circuit 19, a driver circuit 20, and a control circuit 21. The laser diode control circuit 3 is integrated into a single IC. The operations of the first switch circuit 12, the DAC 16, and the DAC arithmetic circuit 17 are controlled by the control circuit 21 to which an APC start signal Sapc is externally input through an input terminal 35.

The photodiode PD, the I/V circuit 2, the voltage comparator circuit 13, the S/H circuit 14, the V/I circuit 15, the adder circuit 19, and the driver circuit 20 may form a bias current generator circuit part, which may also include a circuit that generates the reference voltage Vref. The DAC 16 and the second switch circuit 18 form a switching current generator circuit part. The DAC arithmetic circuit 17 forms an offset current setting circuit part. The reference voltage divider circuit 11, the first switch circuit 12, and the control circuit 21 form an initialization circuit part.

The voltage comparator circuit 13 includes an operational amplifier. The monitor voltage Vm input from an input terminal 31 and the output voltage of the first switch circuit 12 are input to the inverting input and the non-inverting input, respectively, of the operational amplifier. The operational amplifier amplifies the difference (difference voltage) between the input voltages, and outputs the amplified voltage. The S/H circuit 14 samples the output voltage of the voltage comparator circuit 13, and holds the sampled voltage. The V/I circuit 15 coverts the voltage sampled and held by the S/H circuit 14 into current, and outputs the current as a bias current ish to the adder circuit 19. The DAC 16 generates a current determined as greater than or equal to a light emission current iη necessary to obtain a desired amount of light emission Po from the threshold current ith of the laser diode LD. The DAC 16 outputs the generated current as a switching current idac to the adder circuit 19 through the second switch circuit 18. The output current of the adder circuit 19, which is generated by adding up the bias current ish and the switching current idac, is input to the driver circuit 20. The driver circuit 20 supplies the input current to the laser diode LD as the laser driving current iop.

The loop of the photodiode PD→the I/V circuit 2→the voltage comparator circuit 13→the S/H circuit 14→the V/I circuit 15→the adder circuit 19→the driver circuit 20→the laser diode LD is an APC loop. Normally, the amount of light of the laser diode LD is always kept constant by the bias current ish output from the V/I circuit 15.

In the laser diode control circuit 3, the sum of the light emission current iη and an offset current iof is set as the switching current idac, and the second switch circuit 18 is closed (ON) at the time of turning ON the laser diode LD and is open (OFF) at the time of turning OFF the laser diode LD based on a data signal Sd input externally from a data input terminal 33. In setting the switching current idac, the bias current ish is set to be smaller than the threshold current ith of the laser diode LD by the amount of the offset current iof, and is determined as a current to constantly flow into the laser diode LD.

Here, the switching current idac and the bias current ish are automatically set in the laser diode control circuit 3 by a predetermined flow called initialization. The predetermined reference voltage Vref for obtaining the desired amount of light Po is input to a reference voltage input terminal 32. The initialization is started by the APC start signal Sapc, which is first input after the start of the laser diode control circuit 3.

At the time of the initialization operation, the control circuit 21 causes the first switch circuit 12 to select the divided voltage Vd output from the reference voltage divider circuit 11 and to output the divided voltage Vd to the voltage comparator circuit 13. At this point, the second switch circuit 18 is open (OFF) so as not to conduct.

The voltage comparator circuit 13 amplifies the difference voltage between the input monitor voltage Vm and divided voltage Vd, and outputs the amplified difference voltage to the S/H circuit 14. The S/H circuit 14 holds the input difference voltage, and the bias current ish to cause the amount of light of the laser diode LD to be (1−N/M)×P is supplied to the laser diode LD through the driver circuit 20.

Next, the control circuit 21 causes the first switch circuit 12 to select the externally input reference voltage Vref and to output the selected reference voltage Vref to the voltage comparator circuit 13. At this point, the second switch circuit 18 is closed (ON) to conduct.

The voltage comparator circuit 13 amplifies the difference voltage between the input monitor voltage Vm and reference voltage Vref, and outputs the amplified difference voltage to the S/H circuit 14 and the DAC 16. After passage of a predetermined period of time since the start of the APC operation, the control circuit 21 causes the DAC 16 to start counting up from zero. The DAC 16 stops counting up when the monitor voltage Vm is equal to the reference voltage Vref. At this point, the DAC arithmetic circuit 17 detects a switching current idac1 of (N/M)×iη from the count value of the DAC 16.

The DAC arithmetic circuit 17 multiplies the detected code by (M+α)/N, and outputs the multiplied detected code to the DAC 16, thereby causing the DAC 16 to generate and output the switching current idac by multiplying the switching current idac1 indicated by the detected code by (M+α)/N as given by the following Eq. (1):

$$idac = idac1 \times (M + \alpha)/N \quad (1)$$
$$= (N/M) \times i\eta \times (M + \alpha)/N$$
$$= (1 + \alpha/M) \times i\eta,$$

where α is zero or a natural number.

That is, in the switching current idac that the DAC arithmetic circuit 17 causes the DAC 16 to generate, the offset current iof of (α/M)×iη is automatically added to the original light emission current iη.

Since the second switch circuit 18 is ON, the bias current ish is caused to be lower than or equal to the threshold current ith by the APC operation as given by the following Eq. (2):

$$ish = ith - (\alpha/M) \times i\eta. \quad (2)$$

That is, by performing the above-described initialization, it is possible to automatically set the switching current idac including the offset current iof and the bias current ish lower than or equal to the threshold current ith in consideration of the amount of the offset current iof without providing a circuit for generating the offset current iof.

Thus, no individual circuit for generating an offset current is required. Accordingly, it is possible to reduce the area and the power consumption of a circuit. Further, by incorporating an offset current into a switching current that is a modulation current, it is possible to keep constant waveform accuracy at the time of current modulation.

Figure 3:
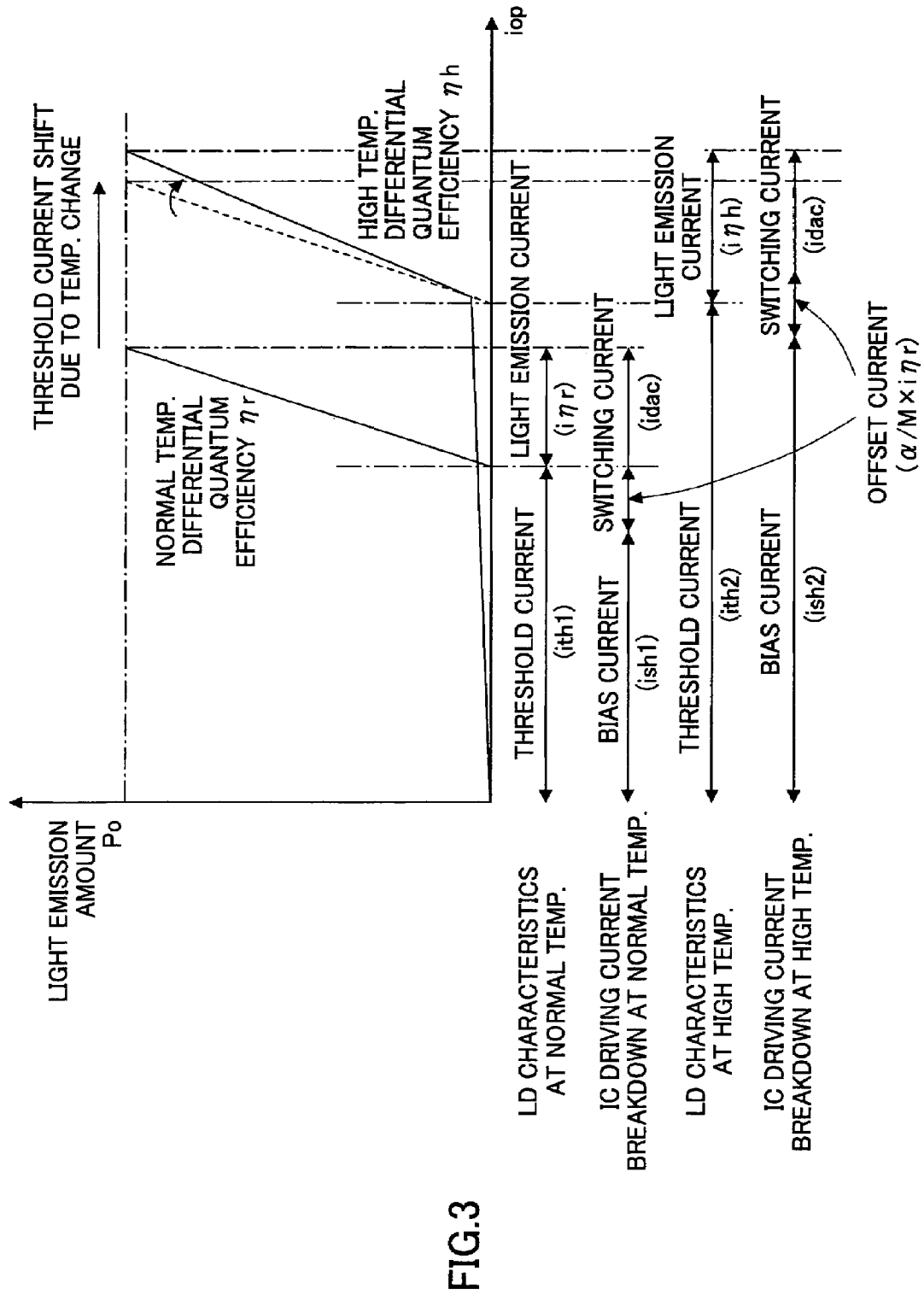
FIG. 3 is a graph showing i-L characteristics of a laser diode of FIG. 2 according to the first embodiment of the present invention.

FIG. 2 illustrates the fundamental concept of the present invention. Accordingly, the above description is given of the case where the value of the offset current iof is fixed. As shown in FIG. 3, the i-L characteristics of the laser diode LD are represented by a broken line made up of a natural light emission straight line where the LD light emission amount Po proportional to the laser driving current iop is obtained from the origin; and a straight line determined by differential quantum efficiency η into which the natural light emission straight line bends with a sharp inclination around the threshold current ith. The point at the intersection of the extension of the straight line determined by the differential quantum efficiency η and the line where the LD light emission amount is zero is called the threshold current ith. The threshold current ith of the laser diode LD shifts because of a change in temperature or degradation over time. Further, the inclination η with respect to the amount of light emission of the light emission current iη is degraded and decreased because of a change in temperature or degradation over time.

In the semiconductor laser driving unit 1 of FIG. 2, a shift in the threshold current ith of the laser diode LD, that is, a variation in the threshold current ith, can be dealt with by outputting the bias current ish corresponding to the individual threshold current ith by performing APC. An increase in the light emission current iη due to a decrease in the differential quantum efficiency η can be dealt with by the offset current iof incorporated into the switching current idac. However, the range of variation of the differential quantum efficiency η differs between individual laser diodes. Accordingly, if the offset current iof set in the DAC arithmetic circuit 17 is large, it takes time before the threshold current ith is reached after starting to cause the switching current idac to flow, thus increasing the light emission delay of the laser diode LD.

Further, if the offset current iof is too small, in the case where the light emission current iη increases because of the differential quantum efficiency η, the bias current ish that exceeds the threshold value ith may be set, so that the laser diode LD may emit weak light even in the setting to turn OFF the laser diode LD. This problem can be solved by setting an offset current corresponding to the variation of the differential quantum efficiency η of an individual laser diode.

A description is given of such a method with reference to FIG. 3.

In FIG. 3, the threshold current of the laser diode LD and the light emission current at the time of normal temperature are indicated by ith1 and iηr, respectively, and the threshold current of the laser diode LD and the light emission current at the time of high temperature are indicated by ith2 and iηh, respectively.

When the above-described initialization is performed at the time of normal temperature, the switching current idac (=iηr+α/M×iηr) is set first, and thereafter, the bias current ish1 is set by APC.

If the ambient temperature of the laser diode LD becomes high, an increase in the laser driving current iop is corrected by APC so that the bias current ish1 is reset to the bias current ish 2 while the switching current idac remains the same as at the time of normal temperature. At this point, because of an increase in the light emission current iη of the laser diode LD, idac should be greater than iηh (idac>iηh) in order to set a bias current ish2 that does not cause the laser diode LD to emit light in the case where the laser diode LD is turned OFF. However, if an excessive margin is reserved so as to cause idac to be much greater than iηh (idac>>iηh), there is the problem of the light emission delay of the laser diode LD. That is, it is necessary to determine the offset current iof (α/M×iη) so that the offset current iof (α/M×iη) is as small as possible on condition that idac>iη holds under any temperature condition in each laser diode LD.

Therefore, the offset current iof may be set to any value based on an external offset current setting signal.

Figure 4:
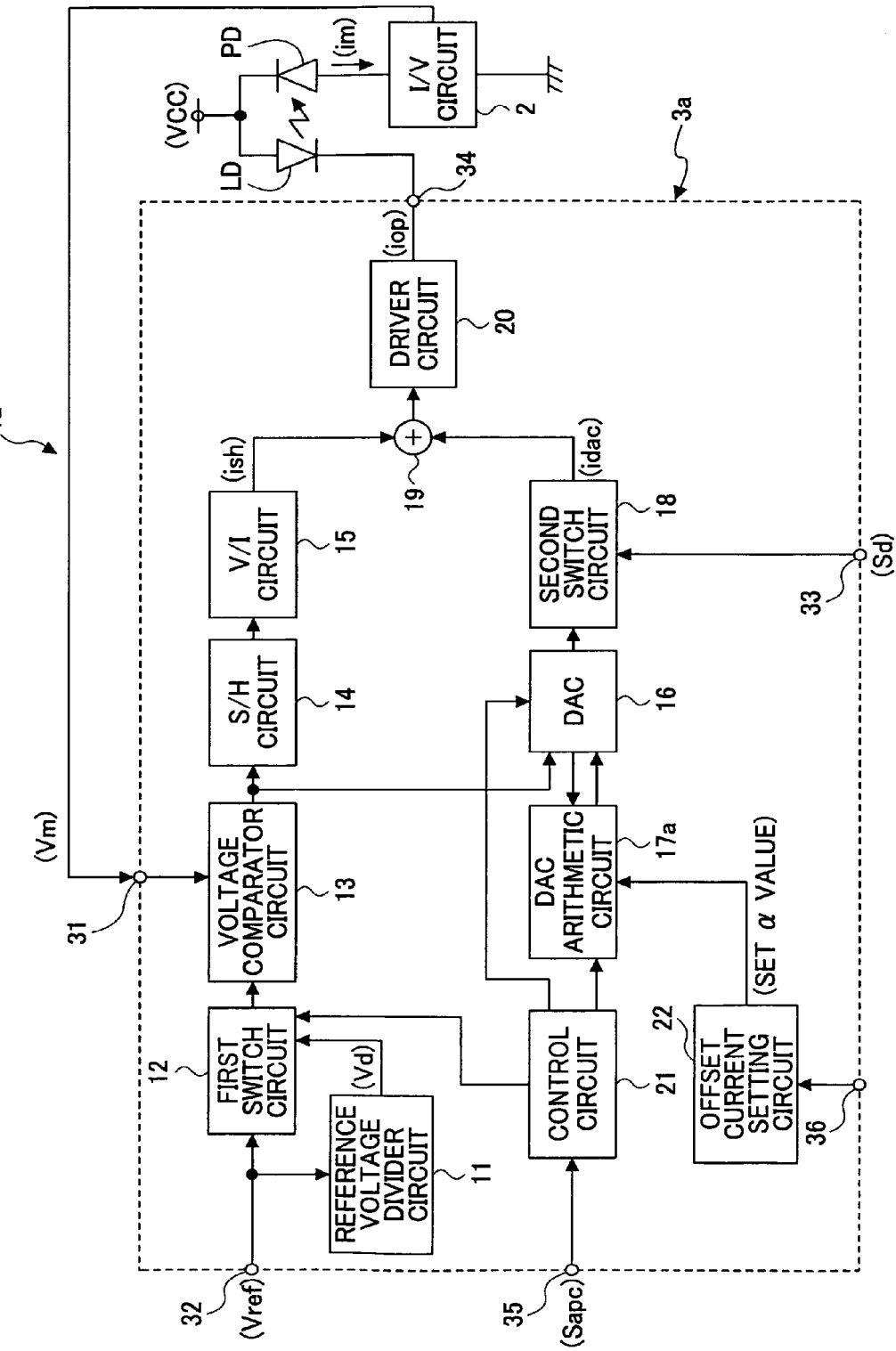
FIG. 4 is a block diagram showing a semiconductor laser driving unit according to a variation of the first embodiment of the present invention.

FIG. 4 is a block diagram showing a semiconductor laser driving unit 1a according to a variation of the first embodiment of the present invention. In FIG. 4, the same elements as those of FIG. 2 are referred to by the same reference numerals, and a description thereof is omitted. A description is given below of differences between FIGS. 2 and 4.

The semiconductor laser driving unit 1a is different from the semiconductor laser driving unit 1 in additionally having an offset current setting terminal 36 and an offset current setting circuit 22. With the addition of the offset current setting terminal 36 and the offset current setting circuit 22, the semiconductor laser driving unit 1a of FIG. 4 includes a DAC arithmetic circuit 17a and a laser diode control circuit 3a in place of the DAC arithmetic circuit 17 and the laser diode control circuit 3, respectively, of the semiconductor laser driving unit 1 of FIG. 2.

Referring to FIG. 4, the semiconductor laser driving unit 1a includes the photodiode PD, the I/V circuit 2, and the laser diode control circuit 3a that generates the laser driving current iop according to the monitor voltage Vm and supplies the generated laser driving current iop to the laser diode LD. The laser diode LD outputs light whose amount is in accordance with the laser driving current iop supplied from the laser diode control circuit 3a.

The laser diode control circuit 3a includes the reference voltage divider circuit 11, the first switch circuit 12, the voltage comparator circuit 13, the S/H circuit 14, the V/I circuit 15, the DAC 16, the DAC arithmetic circuit 17a, the second switch circuit 18, the adder circuit 19, the driver circuit 20, the control circuit 21, and the offset current setting circuit 22. The laser diode control circuit 3a is integrated into a single IC, and includes the offset current setting terminal 36. The DAC arithmetic circuit 17a and the offset current setting circuit 22 may form an offset current setting circuit part.

If a signal input from the offset current setting terminal 36 is, for example, voltage, the offset current setting circuit 22 includes an A/D converter that converts the input analog signal into a digital signal. The offset current setting circuit 22 outputs a signal according to the signal input from the offset current setting terminal 36 to the DAC arithmetic circuit 17a. The DAC arithmetic circuit 17a determines the value of $\alpha$ corresponding to the signal input from the offset current setting circuit 22, where $\alpha$ is a value in the offset current iof ($\alpha/M \times i\eta$) and is zero or a natural number (1, 2, 3, ...). The values of M and N set in the reference voltage divider circuit 11 are input in advance to the DAC arithmetic circuit 17a, where M and N are positive integers (1, 2, 3, ...).

In the above-described initialization, the DAC arithmetic circuit 17a calculates the switching current idac1 of $N/M \times i\eta$ detected from the count value of the DAC 16. In the method described with reference to FIG. 2, in which the offset current iof of $\alpha/M \times i\eta$ is automatically added to the original light emission current i$\eta$ by setting idac by determining the code to be output to the DAC 16 in the DAC arithmetic circuit 17a, any offset current can be set easily by changing the value of $\alpha$ in accordance with an externally input signal.

Thus, according to the semiconductor laser driving unit (1, 1a) of the first embodiment, the offset current iof of any current value is automatically incorporated into the switching current idac using the current output-type DAC 16. Therefore, there is no need to configure an independent offset current generator circuit in the internal circuit of the semiconductor laser driving unit. Accordingly, it is possible to reduce the area and the power consumption of the circuit. Further, this configuration is particularly effective in the case where a high speed operation, in which timing control at the time of simultaneously starting the offset current and the switching current matters, is required.

Second Embodiment

In the above-described first embodiment, the offset current iof of $\alpha/M \times i\eta$ is automatically added to the original light emission current i$\eta$ by setting idac by determining the code to be output to the DAC 16 in the DAC arithmetic circuit 17 or 17a. Alternatively, according to a second embodiment of the present invention, multiple divided voltages may be generated in the reference voltage divider circuit 11, and one of the divided voltages may be exclusively selected in accordance with an externally input offset selecting signal so as to be output to the voltage comparator circuit 13.

Figure 5:
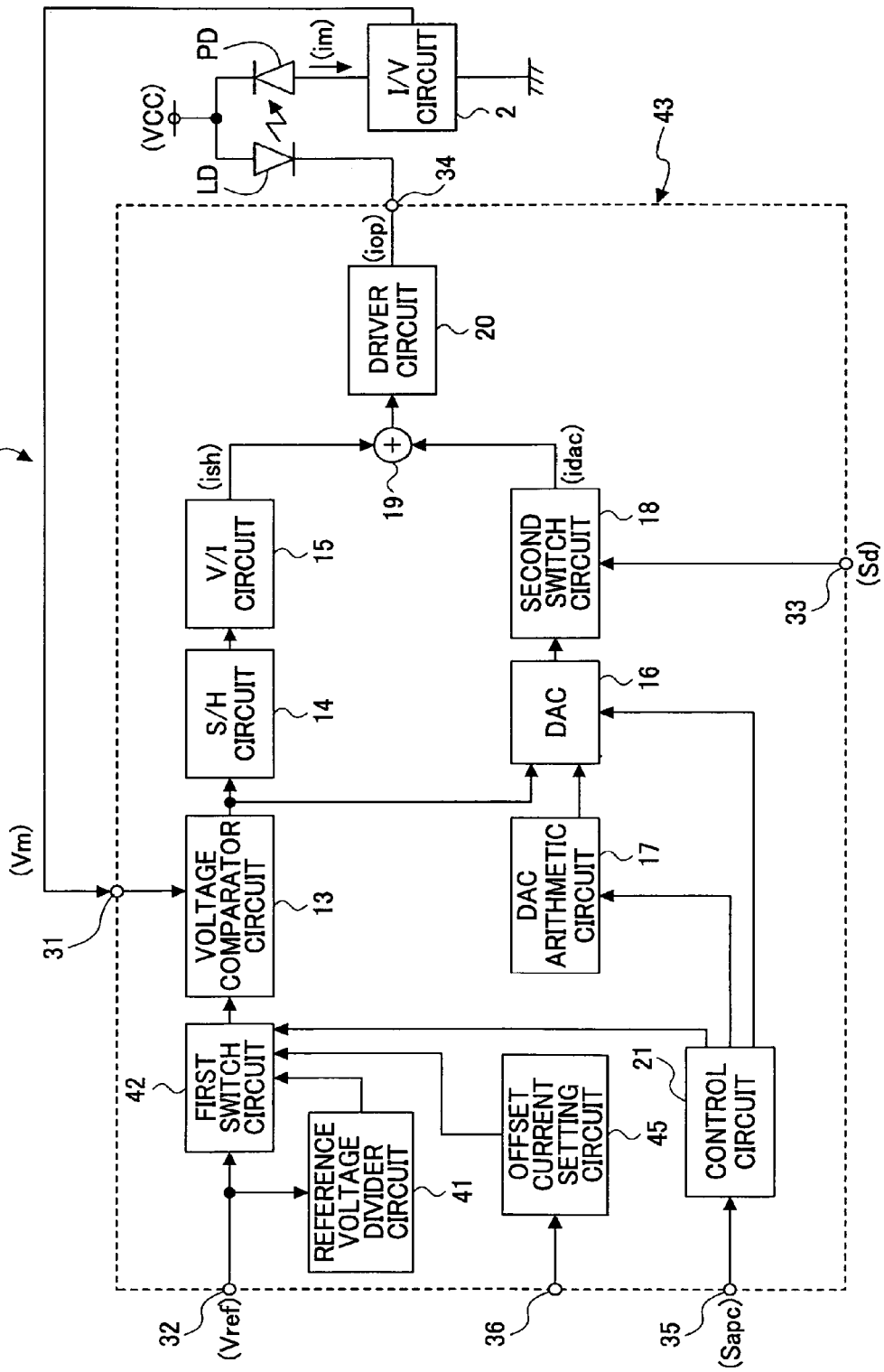
FIG. 5 is a block diagram showing a semiconductor laser driving unit according to a second embodiment of the present invention.

FIG. 5 is a block diagram showing a semiconductor laser driving unit 40 according to the second embodiment of the present invention. In FIG. 5, the elements same as or similar to those of FIG. 2 or 4 are referred to by the same reference numerals, and a description thereof is omitted. A description is given below of differences between FIGS. 2 and 5.

The semiconductor laser driving unit 40 is different from the semiconductor laser driving unit 1 in additionally having the offset current setting terminal 36 and an offset current setting circuit 45. Further, the semiconductor laser driving unit 40 is also different from the semiconductor laser driving unit 1 in that a reference voltage divider circuit 41, which replaces the reference voltage divider circuit 11 of FIG. 2, generates multiple divided voltages and outputs the generated divided voltages to a first switch circuit 42, which replaces the first switch circuit 12 of FIG. 2, and that the first switch circuit 42 exclusively selects one of the input divided voltages in accordance with a control signal fed from the offset current setting circuit 45. With the above-described change, the semiconductor laser driving unit 40 includes a laser diode control circuit 43 in place of the laser diode control circuit 3 of FIG. 2.

Referring to FIG. 4, the semiconductor laser driving unit 40 includes the photodiode PD, the I/V circuit 2, and the laser diode control circuit 43 that generates the laser driving current iop according to the monitor voltage Vm and supplies the generated laser driving current iop to the laser diode LD. The laser diode LD outputs light whose amount is in accordance with the laser driving current iop supplied from the laser diode control circuit 43.

The laser diode control circuit 43 includes the reference voltage divider circuit 41 and the first switch circuit 42. The reference voltage divider circuit 41 divides the externally input reference voltage Vref using (m−1) voltage division ratios, and outputs resultant (m−1) divided voltages (fractions of Vref). The first switch circuit 42 exclusively outputs either the reference voltage Vref or one of the divided voltages output from the reference voltage divider circuit 41.

The laser diode control circuit 43 further includes the voltage comparator circuit 13, the S/H circuit 14, the V/I circuit 15, the DAC 16, the DAC arithmetic circuit 17, the second switch circuit 18, the adder circuit 19, the driver circuit 20, the control circuit 21, and the offset current setting circuit 45. The laser diode control circuit 43 is integrated into a single IC, and includes the offset current setting terminal 36. The DAC arithmetic circuit 17, the reference voltage divider circuit 41, the first switch circuit 42, and the offset current setting circuit 45 may form an offset current setting circuit part. The reference voltage divider circuit 41, the first switch circuit 42, and the control circuit 21 form an initialization circuit part.

The first switch circuit 42 selects one of the divided voltages input from the reference voltage divider circuit 41 in accordance with a selection signal fed from the offset current setting circuit 45, and exclusively outputs either the selected one of the divided voltages or the reference voltage Vref in accordance with a control signal fed from the control circuit 21.

Figure 6:
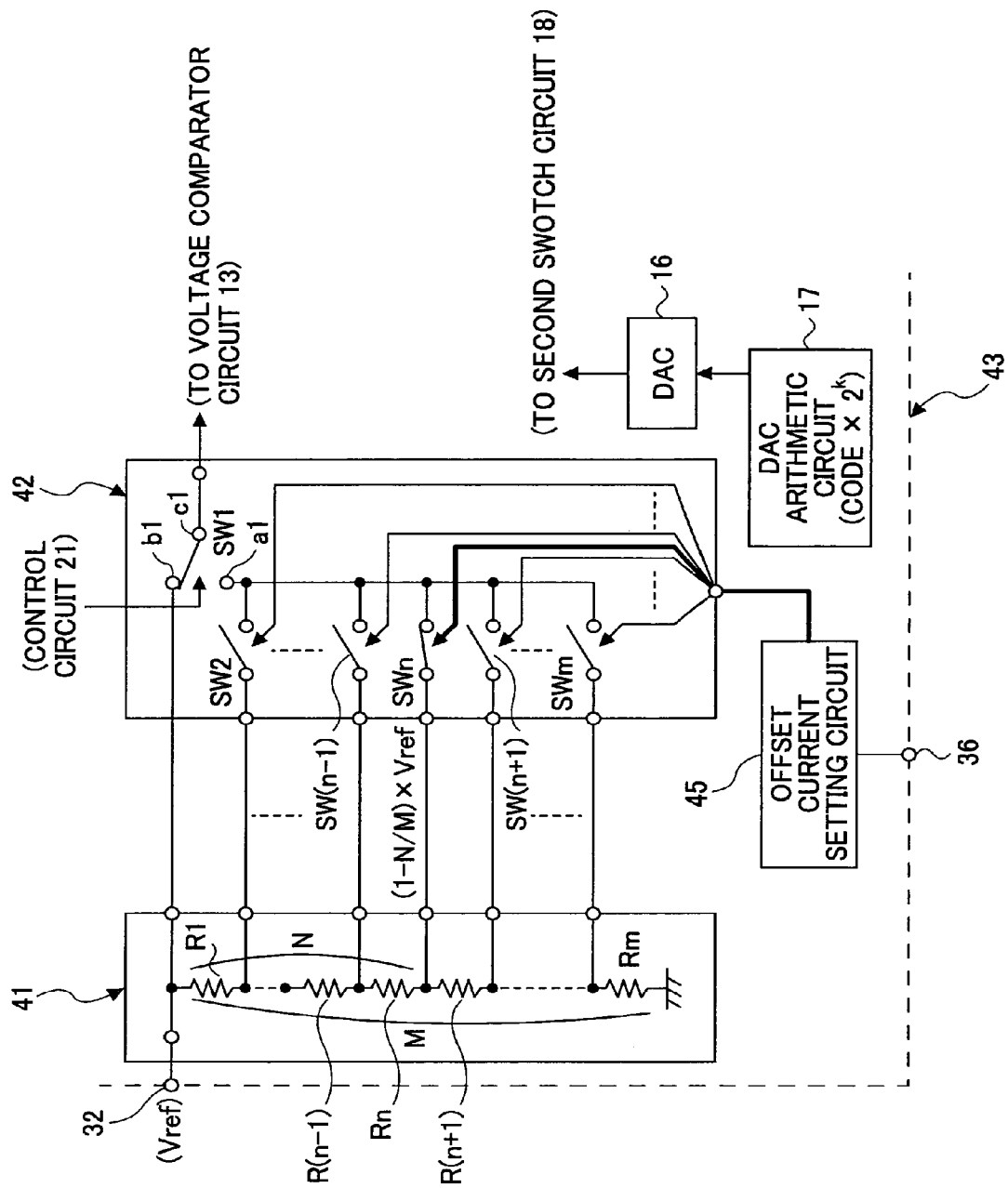
FIG. 6 is a diagram showing internal configurations of a reference voltage divider circuit and a first switch circuit of FIG. 5 according to the second embodiment of the present invention.

FIG. 6 is a diagram showing internal configurations of the reference voltage divider circuit 41 and the first switch circuit 42. A description is given below, with reference to FIG. 6, of operations of the first switch circuit 42 and the offset current setting circuit 45.

Referring to FIG. 6, the reference voltage divider circuit 41 includes m resistors R1 through Rm connected in series between the reference voltage Vref and ground. The first switch circuit 42 includes m switches SW1 through SWm.

The switches SW2 through SWm have respective first terminals connected to one another, and the connections are connected to a terminal a1 of the switch SW1. The reference voltage Vref is input to a terminal b1 of the switch SW1. A terminal c1 of the switch SW1 is connected to the voltage comparator circuit 13. Further, the other or second terminals of the switches SW2 through SWm are connected to the corresponding connections of the resistors R1 through Rm.

The switch SW1 is switched by a control signal fed from the control circuit 21. Only one of the switches SW2 through SWm is exclusively closed (ON) to conduct based on a selection signal fed from the offset current setting circuit 45.

Here, if a signal indicative of closing the switch SWn connected to the connection of the resistor Rn and the resistor R(n+1) (m and n are positive integers satisfying n<m) is input to the offset current setting terminal 36, the offset current setting circuit 45 exclusively closes the switch SWn. Letting the resistance of the series circuit of the resistors R1 through Rn be N and letting the resistance of the series circuit of the resistors R1 through Rm be M, a voltage of $(1-N/M) \times Vref$ is input to the terminal a1 of the switch SW1.

Immediately after the initialization, the terminal c1 of the switch SW1 is connected to the terminal a1 thereof by the control circuit 21, so that the voltage of $(1-N/M) \times Vref$ is input to the voltage comparator circuit 13. As a result, a switching current of $N/M \times i\eta$ is obtained. The DAC arithmetic circuit 17 is preset so as to multiply a DAC code indicating a current of $N/M \times i\eta$ by $2^k$ (two to the $k^{th}$ power). Here, $2^k$ is employed as a multiplier in order to simplify operations. The code can be multiplied by $2^k$ simply by shifting the code by k bits. As a result of processing in the DAC arithmetic circuit 17, the final value of the switching current idac is $2^k \times N/M \times i\eta$ and the final value of the offset current iof is $(2^k \times N/M - 1) \times i\eta$. However, each value should be set within the range of $2^k \times N \geq M$.

For example, letting the resistance M be 10 kΩ and letting the constant k be 1 in FIG. 6, it is assumed that the resistance N can be selected from the range of 5 kΩ to 10 kΩ based on $2^k \times N \geq M$. If a signal to exclusively close one of the switches SW2 through SWm which one causes N to be 6 kΩ is input from the offset current setting terminal 36, the offset current iof of $(2^1 \times 6/10 - 1) \times i\eta = 1/5 \times i\eta$ can be easily obtained by performing initialization. If the value of N is finely divided, it is possible to set the value of the offset current iof more finely.

Thus, according to the semiconductor laser driving unit 40 of the second embodiment, it is possible to produce the same effects as in the first embodiment.

The semiconductor laser driving units 1, 1a, and 40 of the first and second embodiments may be employed in image forming apparatuses such as laser printers and digital copiers.

The present invention is not limited to the specifically disclosed embodiments, and variations and modifications may be made without departing from the scope of the present invention.

The present application is based on Japanese Priority Patent Application No. 2005-255324, filed on Sep. 2, 2005, the entire contents of which are hereby incorporated by reference.

What is claimed is:

1. A semiconductor laser driving unit controlling driving of a semiconductor laser by performing automatic power control to automatically control a current to be supplied to the semiconductor laser so that a desired amount of light emission is obtained, the semiconductor laser driving unit comprising:

a bias current generator circuit part configured to generate a predetermined bias current lower than an oscillation threshold current of the semiconductor laser and constantly output the generated bias current to the semiconductor laser;

a switching current generator circuit part configured to generate a first current for causing the semiconductor laser to emit light, and to output the generated first current to the semiconductor laser in accordance with a control signal input to the switching current generator circuit part;

an initialization circuit part configured to perform a predetermined initialization operation to detect a light emission characteristic of the semiconductor laser, and to cause the switching current generator circuit part to generate a second current of a value obtained from the detected light emission characteristic; and an offset current setting circuit part configured to cause the switching current generator circuit part to generate the first current in which a set offset current is added to the second current, wherein the bias current generator circuit part detects an amount of light emission of the semiconductor laser, and generates and outputs the bias current so that the amount of light emission of the semiconductor laser produced by a sum of the generated bias current and the first current output from the switching current generator circuit part is a predetermined value, and wherein the offset current is externally set in the offset current setting circuit part.

2. An image forming apparatus including a semiconductor laser driving unit controlling driving of a semiconductor laser by performing automatic power control to automatically control a current to be supplied to the semiconductor laser so that a desired amount of light emission is obtained, wherein:

the semiconductor laser driving unit comprises a bias current generator circuit part configured to generate a predetermined bias current lower than an oscillation threshold current of the semiconductor laser and constantly output the generated bias current to the semiconductor laser;

a switching current generator circuit part configured to generate a first current for causing the semiconductor laser to emit light, and to output the generated first current to the semiconductor laser in accordance with a control signal input to the switching current generator circuit part;

an initialization circuit part configured to perform a predetermined initialization operation to detect a light emission characteristic of the semiconductor laser, and to cause the switching current generator circuit part to generate a second current of a value obtained from the detected light emission characteristic; and an offset current setting circuit part configured to cause the switching current generator circuit part to generate the first current in which a set offset current is added to the second current, wherein the bias current generator circuit part detects an amount of light emission of the semiconductor laser, and generates and outputs the bias current so that the amount of light emission of the semiconductor laser produced by a sum of the generated bias current and the first current output from the switching current generator circuit part is a predetermined value, and wherein the offset current is externally set in the offset current setting circuit part.

* * * * *